United States Patent
Matsuzawa

(10) Patent No.: US 7,295,027 B2
(45) Date of Patent: Nov. 13, 2007

(54) SEMICONDUCTOR DEVICE SOCKET AND SEMICONDUCTOR DEVICE CONNECTING METHOD USING ANISOTROPIC CONDUCTIVE SHEET

(75) Inventor: Hajime Matsuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 379 days.

(21) Appl. No.: 11/084,102

(22) Filed: Mar. 21, 2005

(65) Prior Publication Data

US 2005/0161800 A1    Jul. 28, 2005

Related U.S. Application Data

(62) Division of application No. 10/446,775, filed on May 29, 2003, now Pat. No. 6,891,386.

(30) Foreign Application Priority Data

Jun. 12, 2002    (JP)    .............................. 2002-170831

(51) Int. Cl.
  *G01R 31/02*    (2006.01)
  *H05K 7/00*    (2006.01)
(52) U.S. Cl. .................... 324/760; 324/158.1; 361/783
(58) Field of Classification Search ...................... None
  See application file for complete search history.

(56) References Cited

U.S. PATENT DOCUMENTS

| | | | |
|---|---|---|---|
| 5,019,944 A | | 5/1991 | Ishii et al. |
| 5,126,656 A | * | 6/1992 | Jones .......................... 324/760 |
| 5,528,159 A | * | 6/1996 | Charlton et al. ............ 324/758 |
| 5,818,700 A | * | 10/1998 | Purinton ...................... 361/760 |
| 6,052,286 A | * | 4/2000 | Worthen et al. ............. 361/765 |
| 6,058,021 A | * | 5/2000 | Yamamoto ................... 361/783 |
| 6,172,878 B1 | * | 1/2001 | Takabayashi et al. ........ 361/760 |
| 6,174,179 B1 | | 1/2001 | Okabe |
| 6,365,438 B1 | * | 4/2002 | Ishida et al. ................. 438/118 |
| 6,509,634 B1 | * | 1/2003 | Lee et al. .................... 257/678 |
| 6,512,184 B1 | * | 1/2003 | Yamada et al. ............. 174/259 |

FOREIGN PATENT DOCUMENTS

| | | |
|---|---|---|
| JP | 10-255940 | 9/1998 |
| JP | 2002-32031 | 1/2002 |

* cited by examiner

*Primary Examiner*—Paresh Patel
(74) *Attorney, Agent, or Firm*—Young & Thompson

(57) ABSTRACT

A semiconductor device socket, in which a semiconductor device is installed, includes a support member on which a substrate is placed, an anisotropic conductive sheet that acts as an intermediary in electric connection between the substrate and the semiconductor device, and heater which heats the anisotropic conductive sheet. The heater heats the anisotropic conductive sheet for expanding the sheet before the semiconductor device is installed in the semiconductor device socket. The semiconductor device is installed in the socket after the anisotropic conductive sheet has been expanded by heat from the heater.

3 Claims, 6 Drawing Sheets

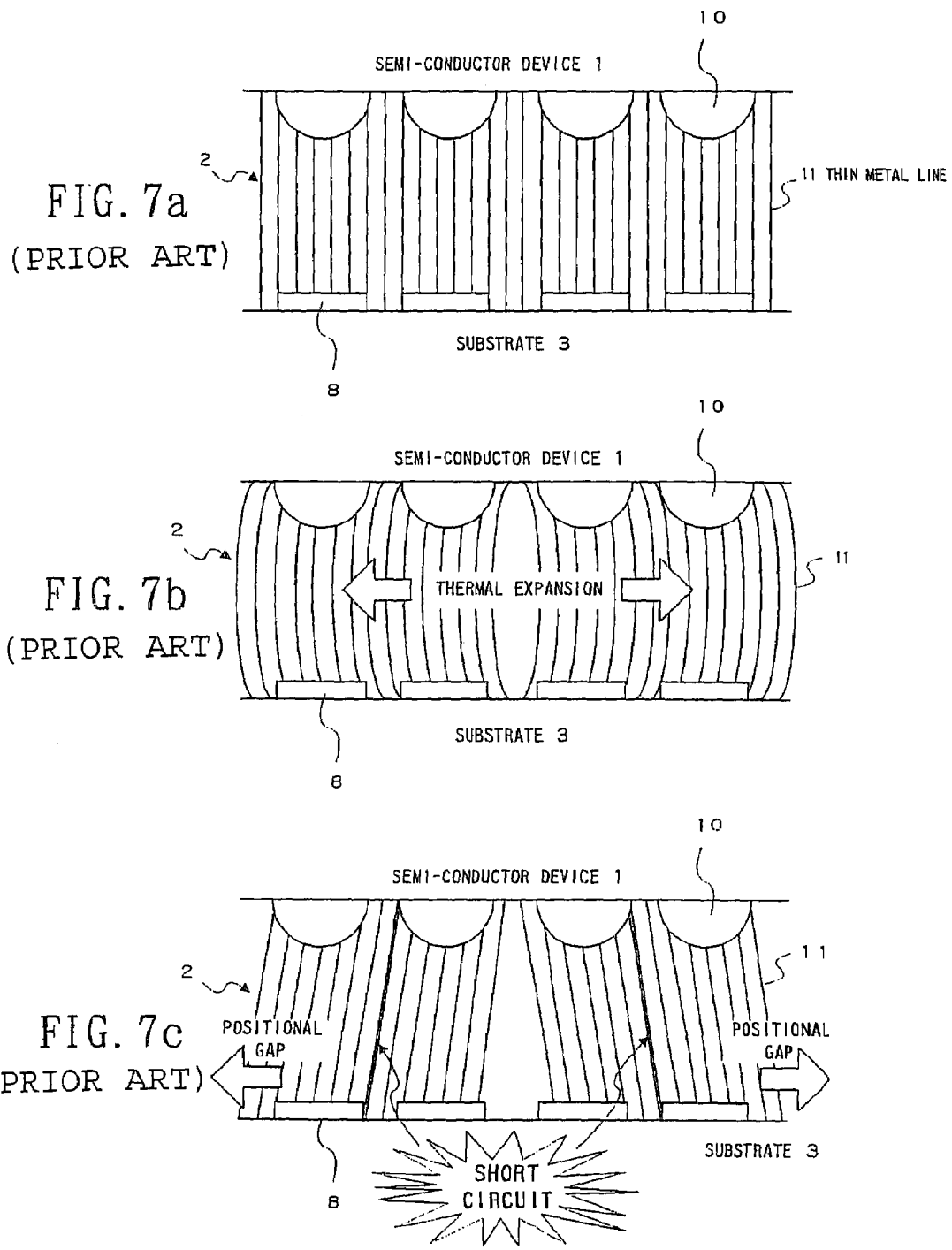

SEMICONDUCTOR DEVICE SOCKET AND SEMICONDUCTOR DEVICE CONNECTING METHOD USING ANISOTROPIC CONDUCTIVE SHEET

This application is a division of application Ser. No. 10/446,775, filed on May 29, 2003 now U.S. Pat No. 6,891,386, which claims benefit of Japanese Application No. 2002-170831, filed on Jun. 12, 2002, the entire contents of which are hereby incorporated by reference.

BACKGROUND OF THE INVENTION

The present invention relates to a semiconductor device socket and a semiconductor device connecting method, and in particular, to a semiconductor device socket and a semiconductor device connecting method using an anisotropic conductive sheet.

Recent semiconductor devices become smaller and have more pins. Accordingly, sockets are required to have terminals with smaller pitches. Thus, an anisotropic conductive sheet is often used in a contact section that electrically connects electrode terminals of the semiconductor device to corresponding electrode terminals of a substrate.

Some anisotropic conductive sheets exhibit conductivity only in their thickness direction or do so when pressed in their thickness direction. For example, a silicon rubber sheet with thin metal lines, a kind of an anisotropic conductive sheet, has a small thickness of about 1 mm. Thus, the silicon rubber sheet is more unlikely to pick up external noise than sockets using spring pins. Consequently, the silicon rubber sheet can accommodate higher clock speed.

However, the anisotropic conductive sheet has much larger coefficient of thermal expansion than semiconductor devices and substrates. Accordingly, heat generated by the semiconductor device operation expands and deforms the anisotropic conductive sheet. This may cause a position gap between the anisotropic conductive sheet and the substrate. In particular, if the semiconductor has terminals with a very small interval such as bare chips, the position gap of the anisotropic conductive sheet from substrate, resulting from the thermal expansion and deformation, is not negligible.

FIG. 6 is a sectional view showing the structure of a conventional semiconductor device socket. A conventional socket 200 has a base plate 5 (support member) on which a substrate 3 is placed, and an anisotropic conductive sheet 2 that electrically connects electrode terminals 10 of the semiconductor device 1 to the corresponding electrode terminals 8 of the substrate 3 placed on the base plate 5. Furthermore, the conventional socket 200 includes a socket frame 9 (guide member), which is provided around the anisotropic conductive sheet 2, to put the semiconductor device 1 in, a pressure plate 4 that presses the semiconductor device 1 along the socket frame 9 from above, and screws 6 used to fix the members of the socket.

In this conventional socket 200, the semiconductor 1 and the substrate 3 are sandwiched between the pressure plate 4 and the base plate 5 to contact the terminals 10 of the semiconductor 1 with the pads 8 (electrode terminals) on the substrate 3 via the anisotropic conductive sheet 2.

FIG. 7 is an enlarged sectional view showing the contact portion in FIG. 6. FIG. 7a shows a state before the semiconductor device starts to operate. FIG. 7b shows a state where the semiconductor device 1 is in operation and generating heat. FIG. 7c shows that heat generated in the semiconductor has caused a positional gap.

The anisotropic conductive sheet 2 is a silicon rubber sheet in which a plurality of thin metal lines 11 that are conductive lines are buried. The thin metal lines 11 electrically connect the terminals 10 of the semiconductor device 1 and the corresponding pads 8 of the substrate together.

FIG. 7a shows a state in which the anisotropic conductive sheet 2 and the substrate 3 are not heated. The terminals 10 of the semiconductor device 1 are connected normally to the corresponding pads 8 of the substrate 3 via the anisotropic conductive sheet 2.

When the semiconductor device 1 begins to operate, the temperatures of the anisotropic conductive sheet 2 and the substrate 3 are increased by heat generated by the device 1. The increase in temperature starts to expand the anisotropic conductive sheet 2 and the substrate 3 as shown in FIG. 7b.

The anisotropic conductive sheet 2 has a much large coefficient of thermal expansion than that of the substrate 3. Thus, position gap is generated between the thin metal lines 11 and the pads 8 of the substrate 3. It may result in short-circuiting the adjacent terminals or connecting the thin metal line 11 to the incorrect pad 8 in the end as shown in FIG. 7c. In particular, if the semiconductor device 1 is formed as a bare chip, the space between the adjacent terminals 10 is very small. Consequently, position gap has a great possibility to cause a short circuit or incorrect connection.

In the description of FIGS. 6 and 7, the anisotropic conductive sheet 2 is an elastic rubber sheet in which the plurality of thin metal lines 11 are buried. Description will be given of another example in which the anisotropic conductive sheet 2 is composed of conductive particles arranged in elastic rubber.

FIG. 8 is an enlarged sectional view showing the contact portion. FIG. 8a shows a state before an operation of the semiconductor device starts. FIG. 8b shows a state where the semiconductor device 1 is in operation and generating heat. FIG. 8c shows that heat generated in the semiconductor has caused a positional gap.

The anisotropic conductive sheet 2 is a silicon rubber sheet composed of a plurality of metal particles 20 arranged in silicon rubber. The pressure plate 4 is used to press the semiconductor device 1 to push the terminals 10 of the semiconductor device 1 into the anisotropic conductive sheet 2. The metal particles 20, which are pushed by the terminals 10, contact with one another to electrically connect the terminals 10 of the semiconductor device 1 to the corresponding pads 8 of the substrate.

FIG. 8a shows a state where the anisotropic conductive sheet 2 and the substrate 3 are not heated. The terminals 10 of the semiconductor device 1 are connected normally to the corresponding pads 8 of the substrate 3 via the anisotropic conductive sheet 2.

When the semiconductor device 1 starts to operate, however, the device 1 itself generates heat resulting in increasing the temperature of the anisotropic conductive sheet 2 and substrate 3. The increase in temperature causes to expansion of the anisotropic conductive sheet 2 as shown in FIG. 8b. This expansion results in positional gap between the metal particles 20 and the pads 8 of the substrate 3 as shown in FIG. 8c. This may cause the adjacent terminals to be short-circuited.

SUMMARY OF THE INVENTION

It is an object of the present invention to provide a semiconductor device socket and a semiconductor device connecting method which can hinder an anisotropic conductive sheet from being expanded in spite of heat generated by the semiconductor device. The present invention can also prevent adjacent terminals of the anisotropic conductive sheet from being short-circuited by heat generated by the semiconductor device.

The semiconductor device socket according to the present invention has an anisotropic conductive sheet, a support member on which a substrate is placed, and a heater which heats the anisotropic conductive sheet. The heater applies heat applied to the anisotropic conductive sheet before the semiconductor device is installed in the socket.

The present invention also provides a semiconductor device connecting method to connect electrode terminals of the semiconductor device to electrode terminals of a substrate via an anisotropic conductive sheet of the semiconductor device socket. The method includes operations as described below. The anisotropic conductive sheet is previously heated before the semiconductor device is installed in the semiconductor device socket which uses the anisotropic conductive sheet. Then, the semiconductor device is installed in the semiconductor device socket. Since the anisotropic conductive sheet is heated before the semiconductor substrate is installed, the anisotropic conductive sheet sandwiched between the semiconductor device and the substrate from being expanded by heat generated in the semiconductor device.

BRIEF DESCRIPTION OF THE DRAWINGS

These and other objects, features and advantages of the invention will become fully apparent from the following detailed description taken in conjunction with accompanying drawings.

FIGS. 3a to 3c and 4a to 4c are enlarged sectional views of a contact portion of the socket, wherein FIGS. 3a and 4a show a condition at normal temperature before installation of the semiconductor device 1, FIGS. 3b and 4b show that anisotropic conductive sheet 2 and the substrate 3 are heated by a heater 7, and FIGS. 3c and 4c show that the semiconductor device 1 is installed and is operating after heating the anisotropic conductive sheet and the substrate;

FIG. 5 is a sectional view showing the structure of the semiconductor device socket which is used for an LSI tester or the like;

FIGS. 7a to 7c and 8a to 8c are enlarged sectional views showing a contact portion of the conventional socket, wherein FIGS. 7a and 8a show a condition before the semiconductor device 1 starts to operate, FIGS. 7b and 8b show that the semiconductor device 1 is generating heat, and FIGS. 7c and 8c show that heat generated by the semiconductor device 1 has caused positional gap.

DETAILED DESCRIPTION OF THE PREFERRED EMBODIMENTS

Figure 1:
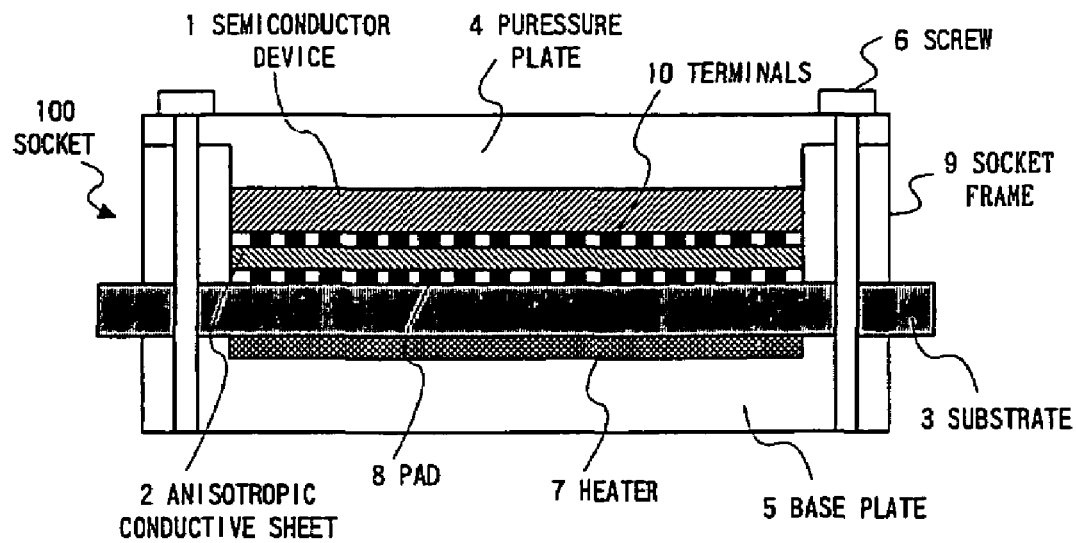
FIG. 1 is a sectional view showing the structure of a semiconductor device socket according to the present invention.

Embodiments of the present invention will be described with reference to the drawings. FIG. 1 shows a structure of a semiconductor device socket according to the present invention. Parts of this semiconductor device socket which are equivalent to those in FIG. 6 are denoted by the same reference numerals.

A socket 100 is composed of a base plate 5 (support member) on which a substrate 3 is placed, an anisotropic conductive sheet 2 that electrically connects electrode terminals of the semiconductor device 1 and corresponding electrode terminals of the substrate 3 placed on the base plate 5 together, a socket frame 9 (guide member) provided around the anisotropic conductive sheet 2 to put the semiconductor device 1 in, a pressure plate 4 that presses the semiconductor device 1 along the socket frame 9 from above, and screws 6 used to fix the members of the socket. The socket 100 also has a heater 7 in the base plate 5 to heat the anisotropic conductive sheet 2 and the substrate 3 before the semiconductor device 1 is installed.

Figure 6:
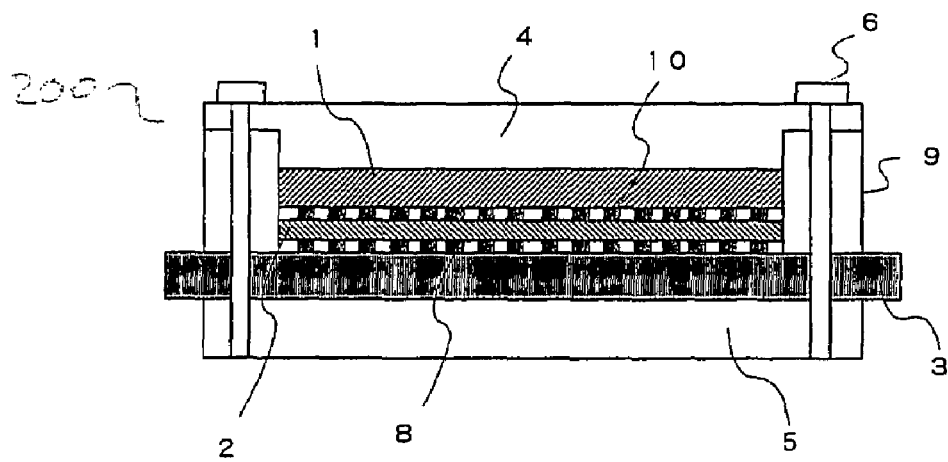
FIG. 6 is a sectional view showing the structure of a conventional semiconductor device socket.
Figure 8A:
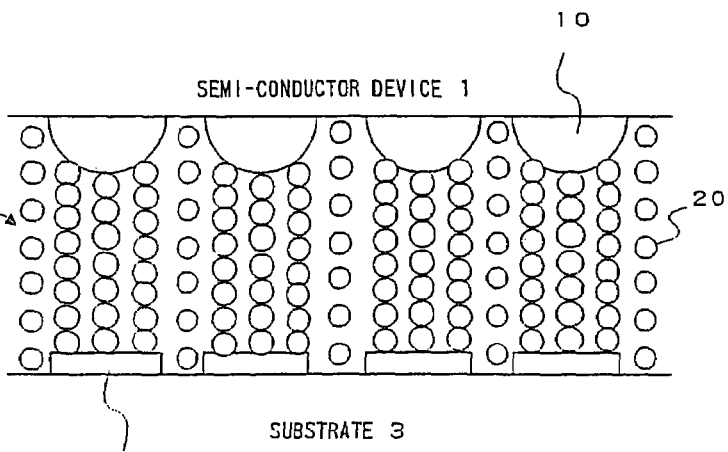
Figure 8B:
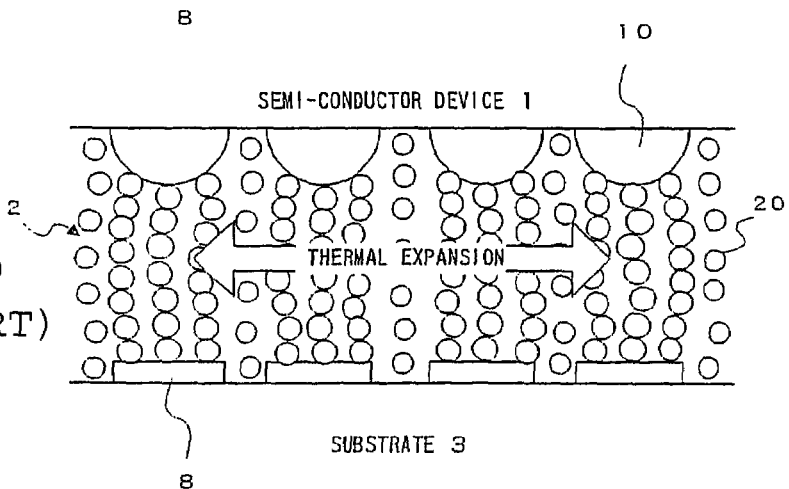
Figure 8C:
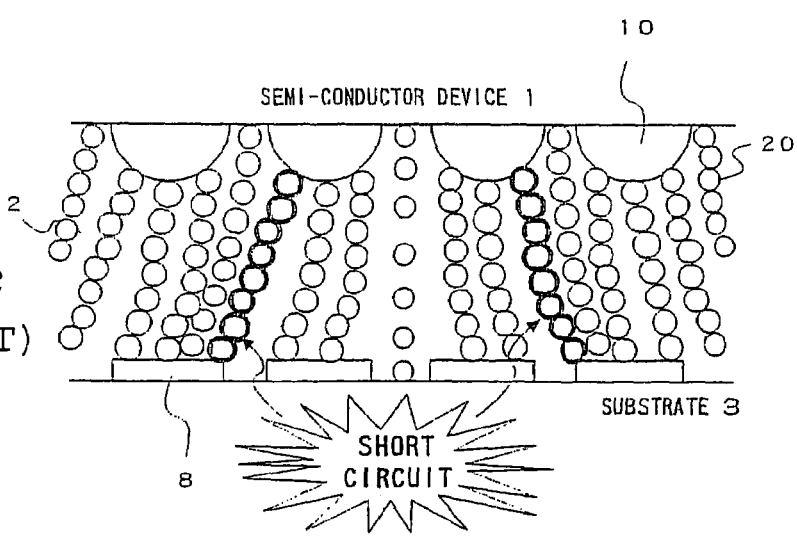

In the socket 100, shown in FIG. 1, the semiconductor substrate 1 and the substrate 3 are sandwiched between the pressure plate 4 and the base plate 5 as in the case with the conventional socket 200 shown in FIG. 6. Then, the socket 100 contacts terminals 10 of the semiconductor device 1 with pads 8 on the substrate 3(electrode terminals of the substrate) via the anisotropic conductive sheet 2.

Figure 2:
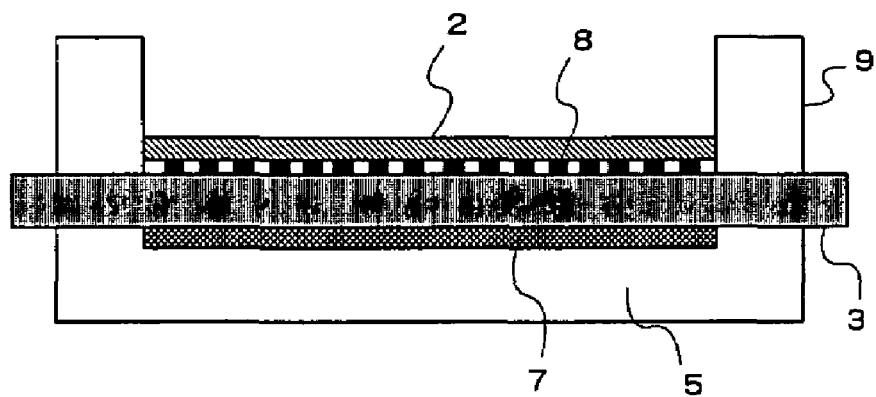
FIG. 2 is a sectional view of a semiconductor device socket showing a condition observed before a semiconductor device 1 is installed in a socket.

FIG. 2 is a sectional view showing a state before the semiconductor device 1 is installed in the socket 100 in FIG. 1. Parts of this socket which are equivalent to those in FIG. 1 are denoted by the same reference numerals.

In FIG. 2, before the semiconductor device 1 is installed in the socket 100, the heater 7, which is contained in the base plate 5, is used to heat and expand the anisotropic conductive sheet 2 and the substrate 3 previously. In this case, the heater 7 heats the anisotropic conductive sheet 2 to a temperature comparable to that measured while the semiconductor device 1 is under operation. Subsequently, as shown in FIG. 1, the semiconductor device 1 is installed. The semiconductor device 1 is contacted with the substrate 3 via the anisotropic conductive sheet 2 heated and expanded by the heater 7.

FIG. 3 is an enlarged sectional view showing a contact portion of the socket 100. As shown in FIG. 3, the anisotropic conductive sheet 2 is a silicon rubber sheet in which a plurality of thin metal lines 11 that are conductive lines are buried. The thin metal lines 11 electrically connect the terminals 10 of the semiconductor device 1 and the corresponding pads 8 of the substrate 3.

Figure 3A:
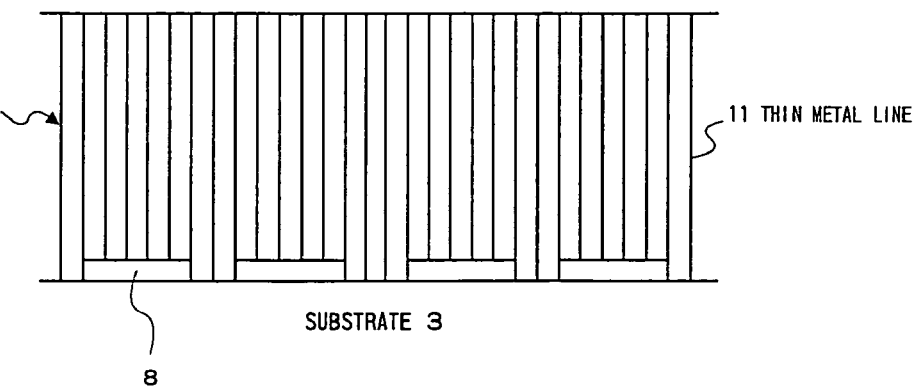
Figure 3B:
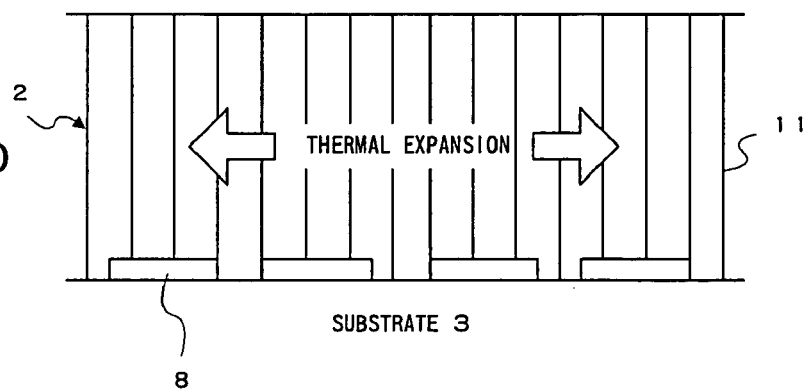

FIG. 3a shows that the semiconductor device 1 has not been installed in the socket 100, and that the anisotropic conductive sheet 2 and the substrate 3 are not heated. In the condition in FIG. 3a, when the heater 7 is used to heat the anisotropic conductive sheet 2 and the substrate 3, their temperatures increase. When their temperatures increase, the anisotropic conductive sheet 2 and the substrate 3 start to expand as shown in FIG. 3b. The anisotropic conductive sheet 2 is expanded compared to its condition at the normal temperature but can expand freely because the semiconductor device 1 is not installed.

Figure 3C:
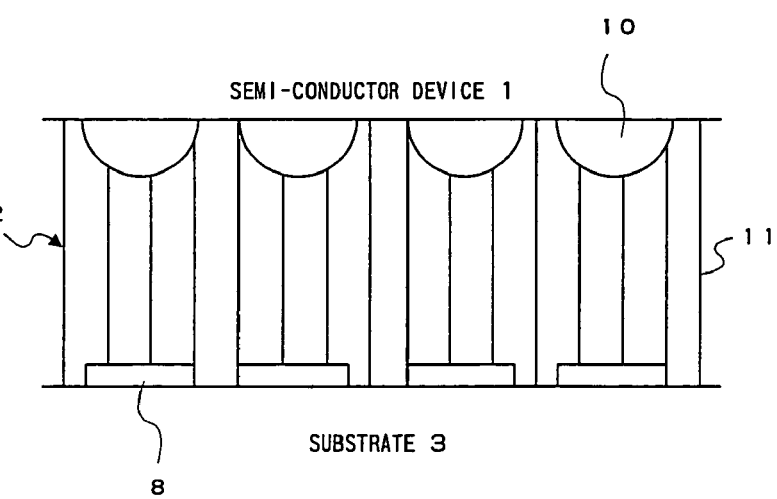

The heater 7 heats the anisotropic conductive sheet 2 until its temperature becomes nearly equal to that measured when the installed semiconductor 1 is under operation. Then, the operation of the heater 7 is stopped. After the operation of the heater 7 has been stopped, the semiconductor device 1 is installed in the socket 100. Even after the semiconductor device 1 has been installed in the socket 100 and has then started to operate to generate heat, the temperature of the anisotropic conductive sheet 2 is not further increased in spite of heat generated by the semiconductor device 1. This is because the anisotropic conductive sheet 2 has already been heated to the temperature nearly equal, to the one measured when the semiconductor device 1 is under operation. Consequently, as shown in FIG. 3c, the anisotropic conductive sheet 2 sandwiched between the semiconductor device 1 and the substrate 3 is not thermally expanded. This prevents the adjacent terminals from being short-circuited by positional gap.

In the description of FIG. 3, the anisotropic conductive sheet 2 is an elastic rubber sheet in which the plurality of thin metal lines 11 are buried. Next, another embodiment will be described. The anisotropic conductive sheet 2 is an elastic rubber sheet in which conductive particles are arranged.

FIG. 4 is an enlarged sectional view showing the contact portion of the socket 100 according to another embodiment of the present invention.

As shown in FIG. 4, the anisotropic conductive sheet 2 is a silicon rubber sheet in which metal particles 20 are arranged in silicon rubber. The pressure plate 4 is used to press the semiconductor device 1 to push the terminals 10 of the semiconductor device 1 into the anisotropic conductive sheet 2. When the terminals 10 are pushed from above, the metal particles 20 are pressed to contact with one another. Moreover, the metal particles 20 electrically connect the terminals 10 of the semiconductor device 1 to the corresponding pads 8 of the substrate.

Figure 4A:
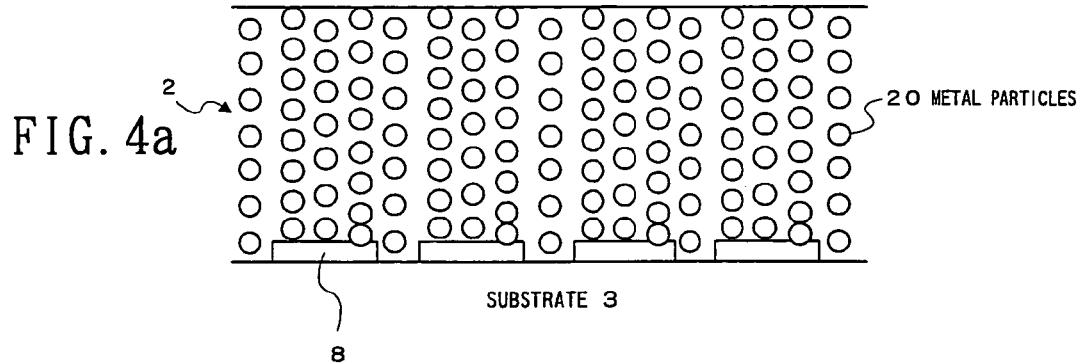
Figure 4B:
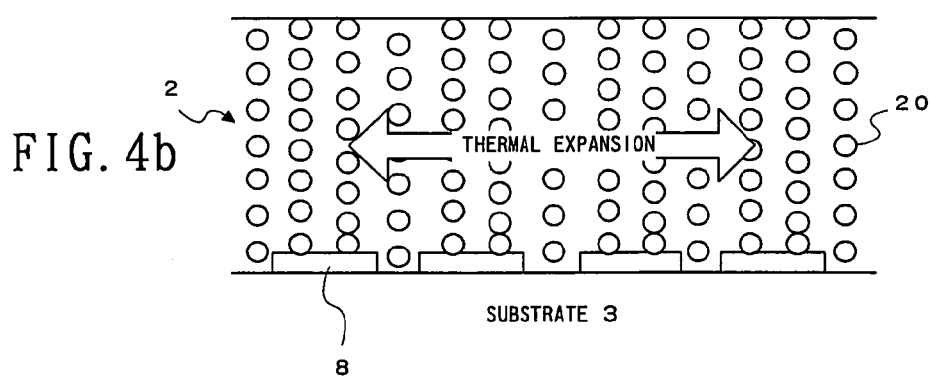

FIG. 4a shows the socket 100, in which the anisotropic conductive sheet 2 and the substrate 3 are not heated. In FIG. 4a, when the heater 7 is used to heat the anisotropic conductive sheet 2 and the substrate 3, their temperatures increase. When their temperatures increase, the anisotropic conductive sheet 2 and the substrate 3 expand as shown in FIG. 4b. The anisotropic conductive sheet 2 is expanded compared to its condition at the normal temperature but can expand freely because the semiconductor device 1 is not installed.

Figure 4C:
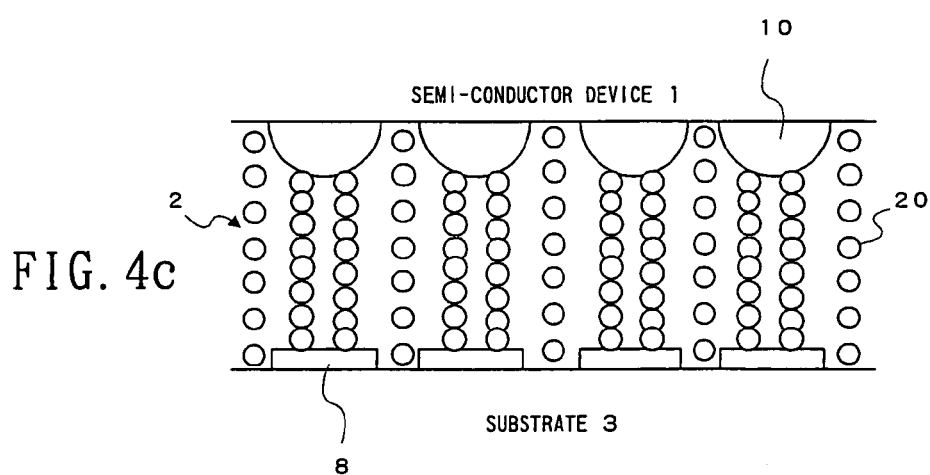

The heater 7 heats the anisotropic conductive sheet 2 until its temperature becomes nearly equal to that measured when the installed semiconductor 1 is under operation. Then, the operation of the heater 7 is stopped. The semiconductor device 1 is then installed in the socket 100. After installation of the semiconductor device 1, even if the semiconductor device 1 generates heat, the temperature of the anisotropic conductive sheet 2 is not increased so much. This is because the anisotropic conductive sheet 2 has already been heated to the temperature comparable to the temperature measured when the semiconductor device 1 is under operation. Consequently, as shown in FIG. 4c, the anisotropic conductive sheet 2 sandwiched between the semiconductor device 1 and the substrate 3 is not thermally expanded.

Figure 5:
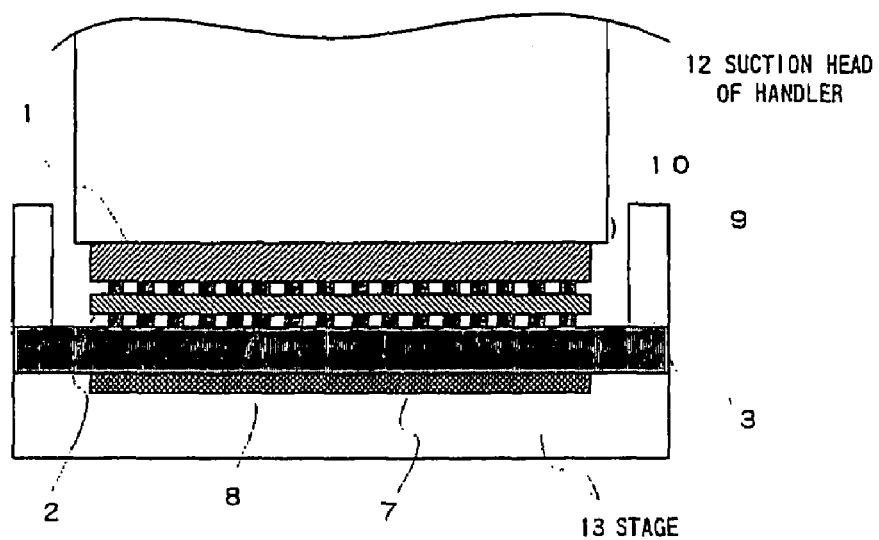

If the semiconductor device socket 100 is used for a facility (LSI tester) that inspects semiconductor devices, or the like, the pressure plate 4 is replaced with a suction head 12 of a handler that is a semiconductor device carrying apparatus, and the base plate 5 is replaced with a stage 13 as shown in FIG. 5. However, similar effects can be produced by installing the heater 7 on the stage 13. In FIG. 5, parts of this socket which are equivalent to those in FIG. 1 are denoted by the same reference numerals.

The effects of the present invention include the ability to hinder the anisotropic conductive sheet from being expanded by heat generated in the semiconductor device. This is because the anisotropic conductive sheet is previously heated before the semiconductor device is installed in the semiconductor device socket which uses the anisotropic conductive sheet. This hinders the anisotropic conductive sheet sandwiched between the semiconductor device and the substrate from being expanded by heat generated in the semiconductor device installed in the socket. It is also possible to prevent the adjacent terminals of the anisotropic conductive sheet from being short-circuited by heat generated in the semiconductor device installed in the socket.

Although the preferred embodiments of the present invention have been described in detail, it should be understood that various changes, substitutions and alternations can be made therein without departing from spirit and scope of the inventions as defined by the appended claims.

What is claimed is:

1. A semiconductor device socket which includes an anisotropic conductive sheet and a support member on which a substrate is placed, wherein electrode terminals of a semiconductor device is electrically connected to corresponding electrode terminals of said substrate via said anisotropic conductive sheet, comprising:
   a heater which heats said anisotropic conductive sheet before said semiconductor device is installed in the socket.

2. The semiconductor device socket according to claim 1, wherein said heater applies heat, which is equivalent to heat applied by said semiconductor device while said semiconductor device is operating, to said anisotropic conductive sheet.

3. The semiconductor device socket according to claim 1, wherein said heater is provided on said support member.

* * * * *